United States Patent
Miura

(10) Patent No.: US 11,368,642 B2
(45) Date of Patent: Jun. 21, 2022

(54) METHOD OF MANUFACTURING SEMICONDUCTOR DEVICE AND METHOD OF MANUFACTURING SOLID-STATE IMAGING DEVICE

(71) Applicant: LAPIS SEMICONDUCTOR CO., LTD., Kanagawa (JP)

(72) Inventor: Noriyuki Miura, Miyagi (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 134 days.

(21) Appl. No.: 16/831,985

(22) Filed: Mar. 27, 2020

(65) Prior Publication Data
US 2020/0314373 A1 Oct. 1, 2020

(30) Foreign Application Priority Data
Mar. 29, 2019 (JP) ............................ JP2019-069321

(51) Int. Cl.
*H04N 5/369* (2011.01)
*H01L 27/146* (2006.01)

(52) U.S. Cl.
CPC ......... *H04N 5/369* (2013.01); *H01L 27/1463* (2013.01); *H01L 27/14692* (2013.01)

(58) Field of Classification Search
CPC .............. H04N 5/369; H01L 27/1463; H01L 27/14692; H01L 27/14687; H01L 21/7624; H01L 21/76264
See application file for complete search history.

(56) References Cited

U.S. PATENT DOCUMENTS 6,284,628 B1* 9/2001 Kuwahara ........... H01L 21/2007
438/959
6,656,271 B2* 12/2003 Yonehara .......... H01L 21/76251
117/913

FOREIGN PATENT DOCUMENTS

JP 2012-080045 A 4/2012
JP 2014-130920 A 7/2014

* cited by examiner

*Primary Examiner* — Seung C Sohn
(74) *Attorney, Agent, or Firm* — Volentine, Whitt & Francos, PLLC

(57) ABSTRACT

A method of manufacturing a semiconductor device and a method of manufacturing a solid-state imaging device, including preparing an SOI wafer in which a silicon layer is disposed on an FZ wafer that is a silicon wafer manufactured according to an FZ method, with an insulation layer being interposed between the silicon layer and the FZ wafer, removing a part of the silicon layer, as an element isolation region, to form a trench for division of the silicon layer, and forming plural circuit elements that each include at least a part of the silicon layer other than the element isolation region, and which are isolated from each other by the element isolation region.

10 Claims, 10 Drawing Sheets

EXAMPLES OF "SLIP" IN FZ-SOI WAFER:
X-RAY TOPOGRAPHY

METHOD OF MANUFACTURING SEMICONDUCTOR DEVICE AND METHOD OF MANUFACTURING SOLID-STATE IMAGING DEVICE

TECHNICAL FIELD

The present disclosure relates to a method of manufacturing a semiconductor device and a method of manufacturing a solid-state imaging device.

BACKGROUND ART

Semiconductor devices for use in solid-state imaging devices are known, which are semiconductor devices where photodiodes and transistors are formed on one semiconductor substrate. For example, Japanese Patent Application Laid-Open (JP-A) No. 2014-130920 and JP-A No. 2012-080045 each disclose such a semiconductor device which is a semiconductor device using a so-called SOI (Silicon On Insulator) wafer in which a silicon layer small in thickness (sometimes referred to as "SOI layer" in the disclosure) is provided on a silicon substrate with an oxide film (insulation film) being interposed therebetween.

An SOI wafer can be used to thereby allow for building up of an optical sensor at the side of a silicon substrate serving as a support substrate and production of circuits at the side of an SOI layer, and thereby allow for building up of circuits on such sensor at the side of the silicon substrate.

SUMMARY OF INVENTION

Technical Problem

The method of manufacturing a semiconductor device disclosed in JP-A No. 2014-130920 and JP-A No. 2012-080045 uses a LOCOS (LOCal Oxidation of Silicon) isolation/field oxidation method as an element isolation method which isolates an Active (active layer) region in which a peripheral circuit such as a transistor is to be formed in the SOI layer. The LOCOS isolation/field oxidation method allows a thermal oxide film to be formed in an element isolation region by a heat treatment at about 1100° C.

A CZ (Czochralski) method and an FZ (Floating Zone) method are mainly known as methods of manufacturing a silicon single crystal ingot for the purpose of obtaining a silicon wafer. In general, the CZ method can manufacture an ingot larger in diameter than the FZ method, and a silicon wafer (CZ wafer) manufactured according to the CZ method is a more inexpensive silicon wafer than a silicon wafer manufactured according to the FZ method. In a case in which a semiconductor device is manufactured using an SOI wafer, and a support substrate is a CZ wafer, an element isolation region can be formed by thermally oxidizing a part of an SOI layer at about 1100° C. according to the LOCOS isolation/field oxidation method.

In a case in which a semiconductor device is manufactured by use of an SOI wafer including a silicon wafer (FZ wafer) manufactured through the FZ method, as a support substrate, a heat treatment is conducted according to the LOCOS isolation/field oxidation method at a maximum temperature of about 1100° C. for several tens of minutes, thereby easily causing any crystal defect called slip to occur in such an FZ wafer as a support substrate.

The disclosure has been made in order to solve the above problems, and an object thereof is to provide a method of manufacturing a semiconductor device, which can manufacture a semiconductor device with the occurrence of slip being suppressed even in the case of use of an SOI wafer including an FZ wafer as a support substrate, and a method of manufacturing a solid-state imaging device.

Solution to Problem

The method of manufacturing a semiconductor device of the disclosure is a method of manufacturing a semiconductor device, the method including:

preparing an SOI wafer in which a silicon layer is disposed on an FZ wafer, which is a silicon wafer manufactured according to an FZ method, with an insulation layer interposed between the silicon layer and the FZ wafer;

removing a part of the silicon layer, as an element isolation region, to form a trench for division of the silicon layer; and forming a plurality of circuit elements that each include at least a part of the silicon layer other than the element isolation region, and which are isolated from each other by the element isolation region.

Advantageous Effect of Invention

The disclosure can provide a method of manufacturing a semiconductor device, which can manufacture a semiconductor device with the occurrence of slip being suppressed even in the case of use of an SOI wafer including an FZ wafer as a support substrate, and a method of manufacturing a solid-state imaging device.

DESCRIPTION OF EMBODIMENTS

Hereinafter, a method of manufacturing a semiconductor device according to an embodiment of the disclosure will be described with reference to the drawings. The same reference sign is given to the same or equivalent component or portion in each drawing, and any overlapping description is appropriately omitted.

The term "step" herein encompasses not only an independent step, but also a step that can achieve a predetermined object even in the case of being not clearly distinguished from other steps.

In a case in which an SOI wafer is used to manufacture a semiconductor device for use in, for example, a solid-state imaging device, a higher electrical resistance of a support substrate as a component of the SOI wafer can allow a depletion layer to more highly extend toward the support substrate at a low voltage, and allow a higher-sensitive solid-state imaging device to be manufactured.

A CZ wafer, although is inexpensive as compared with an FZ wafer, is a silicon wafer including interstitial oxygen due to incorporation of oxygen from a quartz crucible into a silicon ingot during manufacturing of such an ingot according to the CZ method. Thus, an SOI wafer including a CZ wafer as a support substrate is used and impurities are incorporated according to progression of a process of manufacturing a semiconductor device, thereby resulting in a reduction in electrical resistance. As a result, a solid-state imaging device, which is manufactured by use of the SOI wafer including such a CZ wafer as a support substrate, has a difficulty in achieving an increased sensitivity.

The FZ wafer, although is expensive as compared with the CZ wafer, does not cause incorporation of oxygen from a quartz crucible into a silicon ingot unlike the case of the CZ method, is higher in purity than the CZ wafer, and allows a high-resistance silicon wafer to be obtained. The present inventors have then considered manufacturing of a high-sensitive solid-state imaging device by use of the SOI wafer including the FZ wafer as a support substrate.

Figure 10:
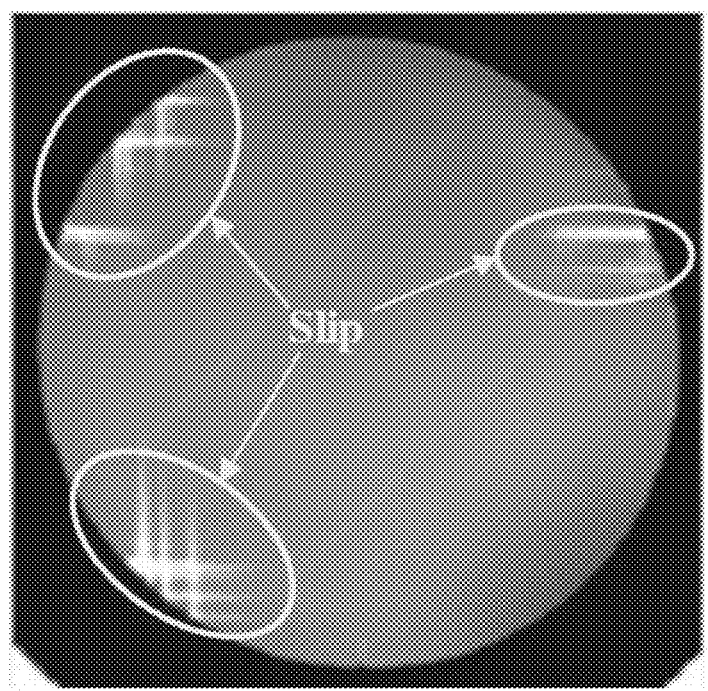
FIG. 10 illustrates one example of slip occurring in an FZ wafer of an SOI wafer including such an FZ wafer as a support substrate.

In this regard, oxygen in a wafer, although causes a reduction in electrical resistance, has an effect of enhancing mechanical strength, and the FZ wafer is lower in strength than the CZ wafer. Thus, in a case in which a heat treatment at a maximum temperature of about 1100° C. for several tens of minutes is performed according to the LOCOS isolation/field oxidation method in formation of an element isolation region in the SOI layer by use of the SOI wafer including the FZ wafer as a support substrate, any crystal defect called slip as illustrated in FIG. 10 occurs in the FZ wafer as a support substrate due to its low mechanical strength. In a case in which such an SOI wafer where any slip occurs is used to manufacture, for example, an image sensor, such slip appears as a "white scratch" in a sensor image.

The inventors have then made studies, and as a result, have found that an SOI wafer including an FZ wafer as a support substrate is used and an element isolation region is formed not according to the LOCOS isolation/field oxidation method, whereby a semiconductor device where the occurrence of slip in the FZ wafer is suppressed can be manufactured, thereby leading to completion of the invention.

Hereinafter, a method of manufacturing a semiconductor device and a method of manufacturing a solid-state imaging device according to embodiments of the disclosure will be specifically described.

First Embodiment

First, a method of manufacturing a semiconductor device according to a first embodiment of the disclosure is described.

The method of manufacturing a semiconductor device according to the first embodiment includes a step of preparing an SOI wafer in which a silicon layer is disposed on an FZ wafer, which is a silicon wafer manufactured according to an FZ method, with an insulation layer interposed between the silicon layer and the FZ wafer, a step of removing a part of the silicon layer, as an element isolation region, to form a trench for division of the silicon layer and a step of forming a plurality of circuit elements that each include at least a part of the silicon layer, other than the element isolation region, and which are isolated from each other by the element isolation region.

Thus, in a case in which a semiconductor device is manufactured in which an SOI wafer including an FZ wafer as a support substrate is used and a plurality of circuit elements such as a transistor and a diode are formed on a silicon layer (SOI layer) disposed on the FZ wafer with an insulation layer interposed between them, a semiconductor device in which the occurrence of slip in the FZ wafer due to a high temperature is suppressed can be manufactured by removing a part of the SOI layer to form a trench as an element isolation region.

Figure 1:
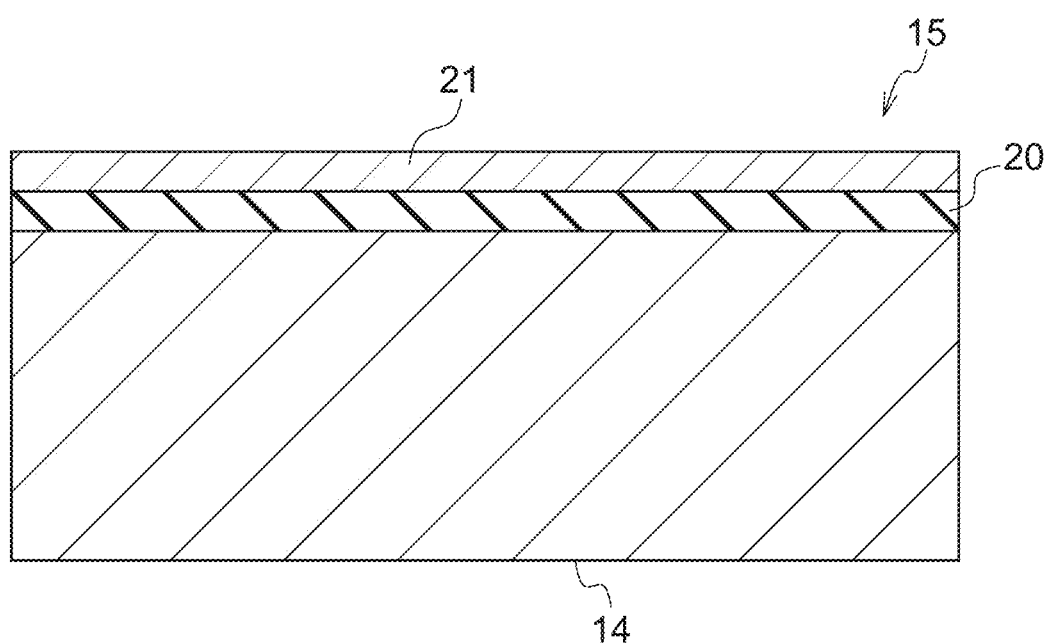
FIG. 1 is a schematic cross-sectional view illustrating one example of a method of manufacturing a semiconductor device according to a first embodiment of the disclosure.
Figure 2:
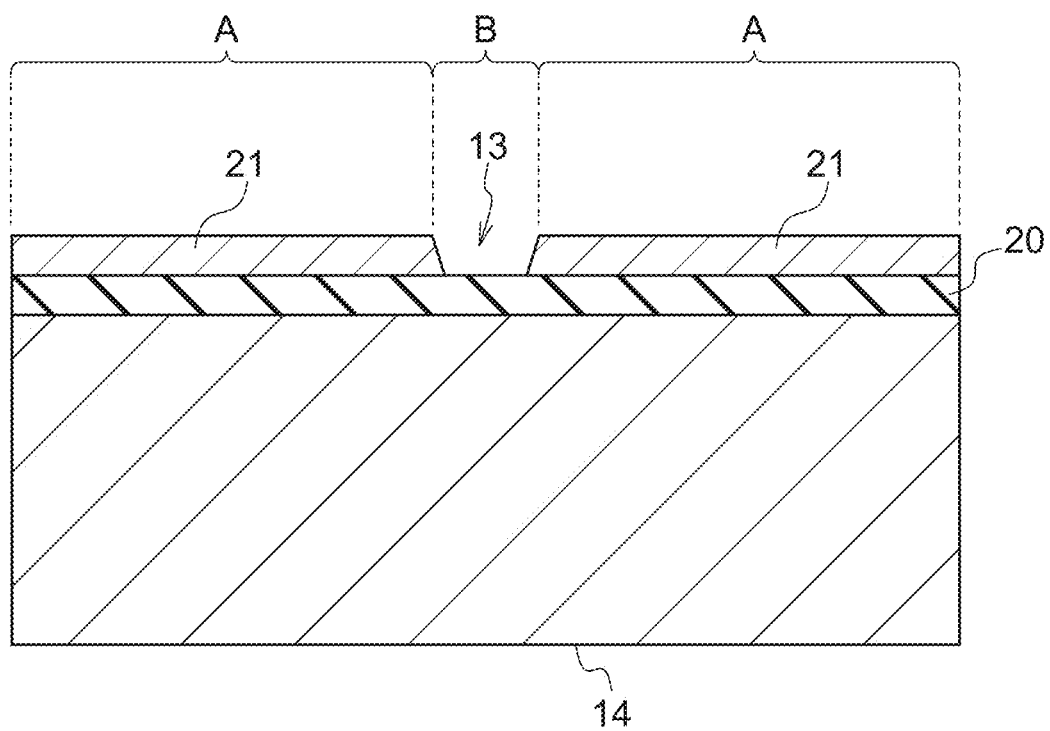
FIG. 2 is a schematic cross-sectional view illustrating one example of a method of manufacturing a semiconductor device according to the first embodiment of the disclosure.

FIG. 1 and FIG. 2 each illustrate one example of the method of manufacturing a semiconductor device according to the first embodiment.

<Preparation of SOI Wafer>

First, an SOI wafer 15 (sometimes referred to as "FZ-SOI wafer" in the disclosure) is prepared, in which a silicon layer (SOI layer) 21 is disposed on an FZ wafer 14 that is a silicon wafer manufactured according to the FZ method, with an insulation layer 20 being interposed between the silicon layer and the FZ wafer (FIG. 1).

Such an SOI wafer 15 including the silicon wafer (FZ wafer) manufactured according to the FZ method, as a support substrate 14, is higher in resistance than an SOI wafer including a CZ wafer as a support substrate, enables a depletion layer to extend to the entire thickness of the support substrate 14, namely, a surface of the support substrate, opposite to the SOI layer 21 disposed, and enables the sensitivity of a sensor to be enhanced.

The insulation layer 20 is usually a silicon oxide film called a BOX (Buried OXide) layer.

The SOI layer 21 is, for example, a silicon layer having a thickness of about 50 nm, and is disposed (supported) on the FZ wafer 14 with the insulation layer 20 interposed between the silicon layer and the FZ wafer.

The SOI wafer 15 for use in the first embodiment is not particularly limited as long as the support substrate is the FZ wafer 14. For example, in a case in which such an SOI wafer is manufactured by bonding two silicon wafers, an FZ wafer 14 is used as a support substrate, and a wafer for forming an SOI layer 21 (wafer for SOI layer formation) may be either an FZ wafer or a CZ wafer, and is preferably a CZ wafer from the viewpoint that the cost is kept low.

For example, an FZ wafer and a CZ wafer which have the same size as each other and which are subjected to mirror polishing are prepared, and an oxide film serving as a BOX layer 20 is formed on at least one surface of the FZ wafer according to a CVD method or the like. One surface of the CZ wafer is implanted with a hydrogen ion to a depth corresponding to the thickness of the SOI layer 21. The surface of the FZ wafer, on which the oxide film is formed, and the ion-implanted surface of the CZ wafer are bonded, and the CZ wafer is peeled after a heat treatment. Such peeling of the CZ wafer occurs from a portion implanted with a hydrogen ion, and a surface of an SOI layer appearing by such peeling is finished by chemical mechanical polishing (CMP). Thus, an SOI wafer 15 can be manufactured in which a silicon layer (SOI layer) 21 small in thickness is formed on a surface of an FZ wafer, with an oxide film interposed between them.

An SOI wafer may also be used in which an SOI layer is formed by bonding an FZ wafer (wafer for a support substrate) and a CZ wafer (wafer for SOI layer formation) and grinding the CZ wafer.

<Removal of Part of SOI Layer>

A part of the SOI layer 21 is removed to form a trench 13 for division of the SOI layer, as an element isolation region B which isolates a plurality of circuit elements by use of the SOI layer 21 (FIG. 2).

The method of removing a part of the SOI layer 21, serving as such an element isolation region B, is not particularly limited as long as no slip occurs in the FZ wafer 14. For example, a photolithography/etching method can be used to remove a predetermined portion of the SOI layer 21 at a high accuracy, thereby forming the trench 13 serving as the element isolation region B. Specifically, the entire surface of the SOI layer 21 is coated with a photo-sensitive insulation material according to a spin coating method, and thereafter subjected to patterning with exposure and development, whereby a resist mask (not illustrated) is formed in a region other than a region in which the trench 13 is to be formed in the SOI layer 21.

The SOI layer 21 in the region in which no resist mask is formed is then removed by, for example, dry etching. The silicon oxide film (BOX layer) 20 is extremely low in etching rate as compared with the silicon (SOI layer) 21, and thus the BOX layer 20 in a region in which the trench 13 is formed in the SOI layer 21 remains and the trench 13 is formed in which the BOX layer 20 is exposed (FIG. 2). The BOX layer 20 as the insulation layer 20 is present in a region in which the trench 13 is formed, and thus the region in which the trench 13 is formed can be defined as the element isolation region B.

A part of the SOI layer 21 is thus removed to form the trench 13 as the element isolation region B, whereby the element isolation region B can be formed without any heat treatment at a high temperature in an element isolation step unlike a method of thermally oxidizing a part of the SOI layer 21 according to the LOCOS isolation/field oxidation method. Therefore, the occurrence of slip in the FZ wafer 14 that is the support substrate is suppressed.

<Formation of Circuit Elements>

A plurality of circuit elements which include at least a part of the SOI layer 21 and which are isolated by the element isolation region B (trench 13) are formed in an element region A of the SOI layer 21.

For example, a resist mask is formed in a predetermined region in the SOI layer 21 according to photolithography, and ion implantation with a p-type impurity element (boron, indium or the like) or n-type impurity element (phosphorus, arsenic or the like) in a predetermined amount and at a predetermined depth is performed in a region where an SOI layer 21 is exposed. While two transistors are formed in FIG. 9 described below, circuit elements may be formed depending on the intended semiconductor device manufactured, without limitation thereto. The circuit elements in the disclosure mean elements as components of an electrical circuit of the semiconductor device, and encompass not only electronic elements such as a transistor and a diode, but also members as components of a part of such a circuit, such as an electrode and a wiring.

A circuit, an electrode, and the like are, if necessary, formed also on the support substrate (FZ wafer) 14. Such circuit, electrode, and the like may be formed on the support substrate (FZ wafer) 14 before formation of the trench 13 in the SOI layer 21. For example, a resist mask (not illustrated) is formed in a predetermined region in the SOI layer 21 before formation of the trench 13 in the SOI layer 21, and n-type or p-type impurity ion implantation is performed to a predetermined depth of the support substrate 14 through the SOI layer 21 and the insulation layer 20, thereby enabling a p-type or n-type semiconductor layer to be formed.

In a case in which, for example, a semiconductor device for an optical sensor is manufactured through the above steps, the occurrence of slip in the FZ wafer 14 that is the support substrate is suppressed in the step of forming the element isolation region, whereby a white scratch in a sensor image can be suppressed.

The FZ wafer 14 that is the support substrate is high in resistance, and thus enables a depletion layer to extend to a deep location of the support substrate at a low voltage and enables a high-sensitive sensor to be obtained.

Second Embodiment

Next, a method of manufacturing a semiconductor device according to a second embodiment of the disclosure is described.

The method of manufacturing a semiconductor device according to the second embodiment is a modification of the method of manufacturing a semiconductor device according to the first embodiment, and is a method further including, after the step of forming the trench, a step of forming an oxide film in the trench according to a CVD method, and a step of heat-treating the oxide film formed in the trench, at a temperature at which no slip occurs in the FZ wafer.

The first embodiment, while enables the occurrence of slip in the support substrate (FZ wafer) 14 to be suppressed, may cause an element isolation end to have a pointed or angulated shape in the case of the trench 13 formed by removal of a part of the SOI layer 21, as the element isolation region B, thereby resulting in the occurrence of any transistor leakage current called a parasitic channel at such an end. An oxide film is then formed inside the trench 13 according to a CVD method, as described above, whereby the thickness of a gate oxide film of a parasitic transistor can be increased to result in an increase in Vt of the parasitic transistor, thereby inhibiting a leakage current from occurring.

Figure 3:
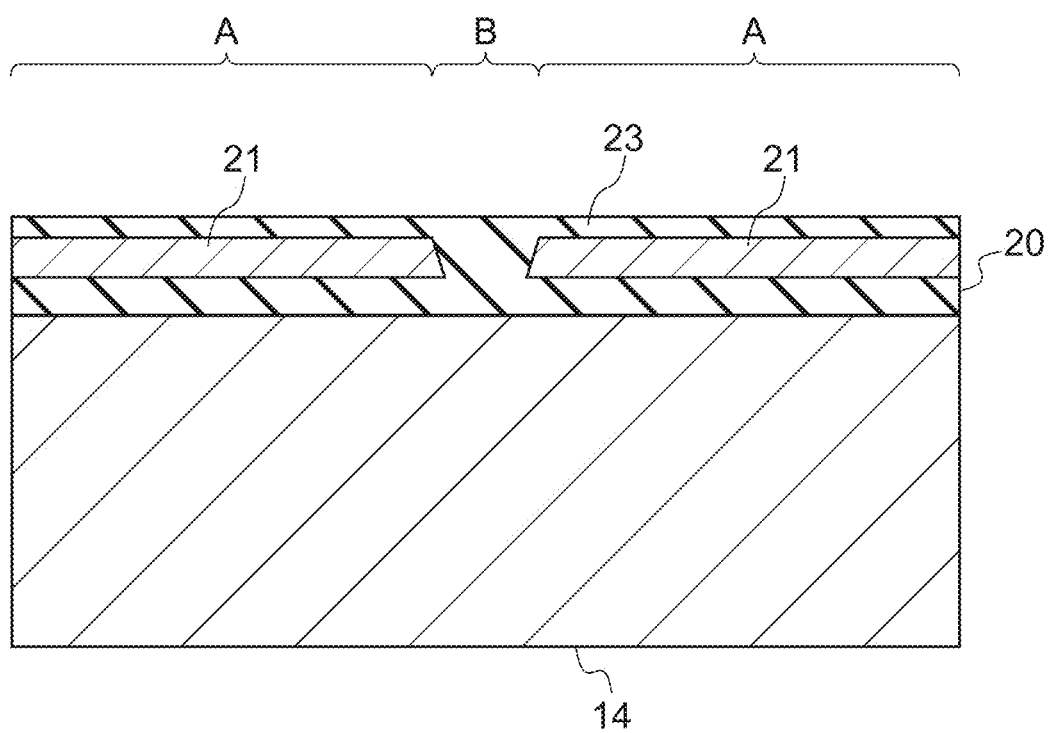
FIG. 3 is a schematic cross-sectional view illustrating one example of a method of manufacturing a semiconductor device according to a second embodiment of the disclosure.
Figure 4:
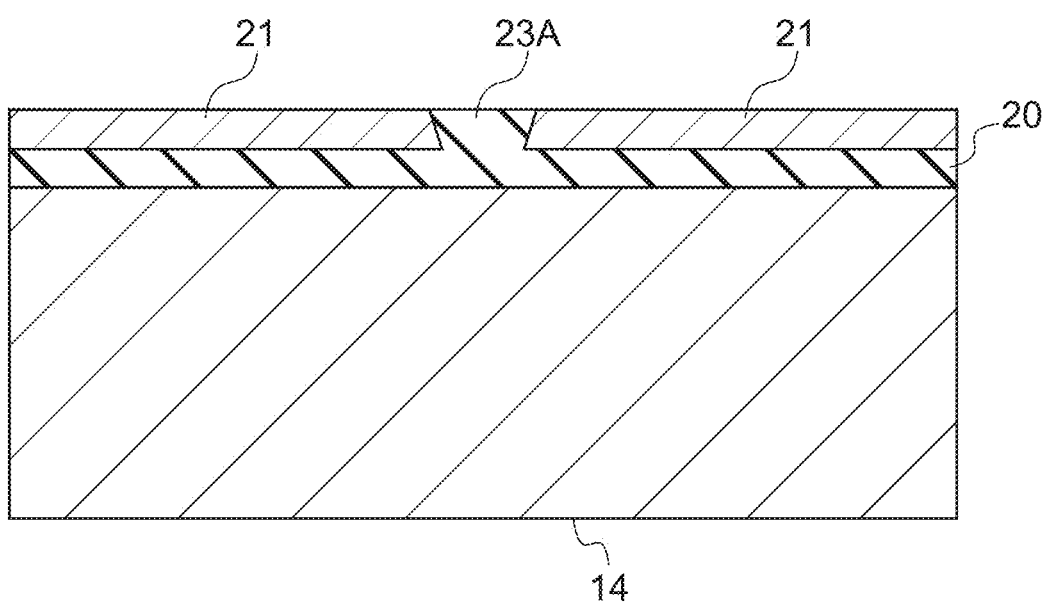
FIG. 4 is a schematic cross-sectional view illustrating one example of a method of manufacturing a semiconductor device according to the second embodiment of the disclosure.

FIG. 3 and FIG. 4 each illustrate one example of the method of manufacturing a semiconductor device according to the second embodiment.

<Preparation of SOI Wafer and Removal of Part of SOI Layer>

An SOI wafer 15 for use in the second embodiment is the same as the FZ-SOI wafer described in the first embodiment, and thus the description thereof is here omitted.

A part of an SOI layer 21 of the SOI wafer 15 is removed to form a trench 13 serving as an element isolation region B. The method of forming the trench 13 is also the same as in the first embodiment, and thus the description thereof is here omitted.

<Formation of Oxide Film Inside Trench>

A part of the SOI layer 21 is removed to form the trench 13 serving as an element isolation region B, and thereafter an oxide film 23 (sometimes referred to as "CVD oxide film" in the disclosure) is formed inside the trench 13 according to a CVD (Chemical Vapor Deposition) method (FIG. 3).

The CVD method can form such an oxide film ($SiO_2$) 23 on the SOI layer 21 and inside the trench 13 at a relatively low temperature. Such a CVD method which here forms the oxide film 23 is not particularly limited as long as the method is any method which causes no slip to occur in the FZ wafer 14. A plasma CVD method or a LPCVD (Low Pressure CVD: Low Pressure Chemical Vapor Deposition) method is suitable from the viewpoint of efficient formation of an $SiO_2$ film to be embedded inside the trench 13, at a relatively low temperature. The plasma CVD method or the LPCVD method can efficiently form such an oxide film 23 to be embedded inside the trench 13.

In a case in which the oxide film 23 is formed according to the CVD method, a CVD oxide film 23 is formed not only inside the trench 13, but also on the SOI layer 21. For example, CMP (Chemical Mechanical Polishing) can remove the oxide film 23 on the SOI layer 21 (element region A), while allowing an oxide film 23A inside the trench 13 to remain (FIG. 4).

<Heat Treatment>

Next, such a CVD oxide film 23A formed inside the trench 13 is heat-treated at a temperature at which no slip occurs in the FZ wafer (support substrate) 14. The oxide film (CVD oxide film) formed according to the CVD method, as it is, is easily removed in the case of being brought into contact with, for example, hydrofluoric acid for use in washing in a subsequent step of forming any circuit element, or the like. The CVD oxide film can be subjected to a heat treatment and thus can be enhanced in durability thereof (durability to hydrofluoric acid or the like).

A too low heat treatment temperature can cause an elongated heat treatment time, thereby causing the effect of enhancing durability of the CVD oxide film 23A inside the trench 13 to be insufficient. A too high heat treatment temperature can cause the occurrence of slip in the FZ wafer 14 that is the support substrate. The heat treatment is then performed at a temperature at which no slip occurs in the FZ wafer. The "temperature at which no slip occurs in the FZ wafer" may be set by, for example, subjecting an FZ wafer as a test sample to the heat treatment with the temperature, the time, and the like being varied. The heat treatment can be usually performed at about 950° C., thereby resulting in not only suppression of the occurrence of slip in the FZ wafer 14, but also an enhancement in durability of the CVD oxide film 23A inside the trench 13.

<Formation of Circuit Element>

Hereafter, a plurality of circuit elements mutually isolated by the element isolation region B are formed by utilizing the SOI layer 21 remaining as the element region A, in the same manner as in the first embodiment.

A circuit, an electrode, and the like are, if necessary, formed also on the support substrate (FZ wafer) 14.

The second embodiment not only enables the occurrence of slip in the support substrate (FZ wafer) 14 to be suppressed, but also allows the CVD oxide film 23A to be formed inside the trench 13, and thus can be more certainly ensured in insulation properties in the element isolation region B and produces a greater thickness of a gate oxide film of a parasitic transistor, compared to the first embodiment. Thus, the parasitic transistor can be increased in Vt and the occurrence of leakage current can be suppressed.

Third Embodiment

Next, a method of manufacturing a semiconductor device according to a third embodiment of the disclosure is described.

The method of manufacturing a semiconductor device according to the third embodiment is a modification of the respective methods of manufacturing a semiconductor device according to the first embodiment and the second embodiment, and is a method further including, after the step of forming the trench, a step of subjecting ends of the silicon layer, which are formed by the division of the silicon layer, to ion implantation.

The third embodiment, while does not essentially involves formation of a CVD oxide film inside the trench, can effectively suppress parasitic channel leakage current because ends of the SOI layer isolated by formation of the trench are subjected to ion implantation to cause a high corresponding channel density of a parasitic transistor and an increase in Vt, even in a case in which parasitic channel leakage current is not sufficiently suppressed even by formation of the oxide film inside the trench as the element isolation region as in, for example, the second embodiment.

Hereinafter, one example of the method of manufacturing a semiconductor device according to the third embodiment will be described with respect to a case in which a trench is formed as an element isolation region in an SOI layer to thereby divide the SOI layer, ends of the SOI layer divided by the trench are subjected to ion implantation and thereafter an oxide film is formed inside the trench according to the CVD method.

Figure 5:
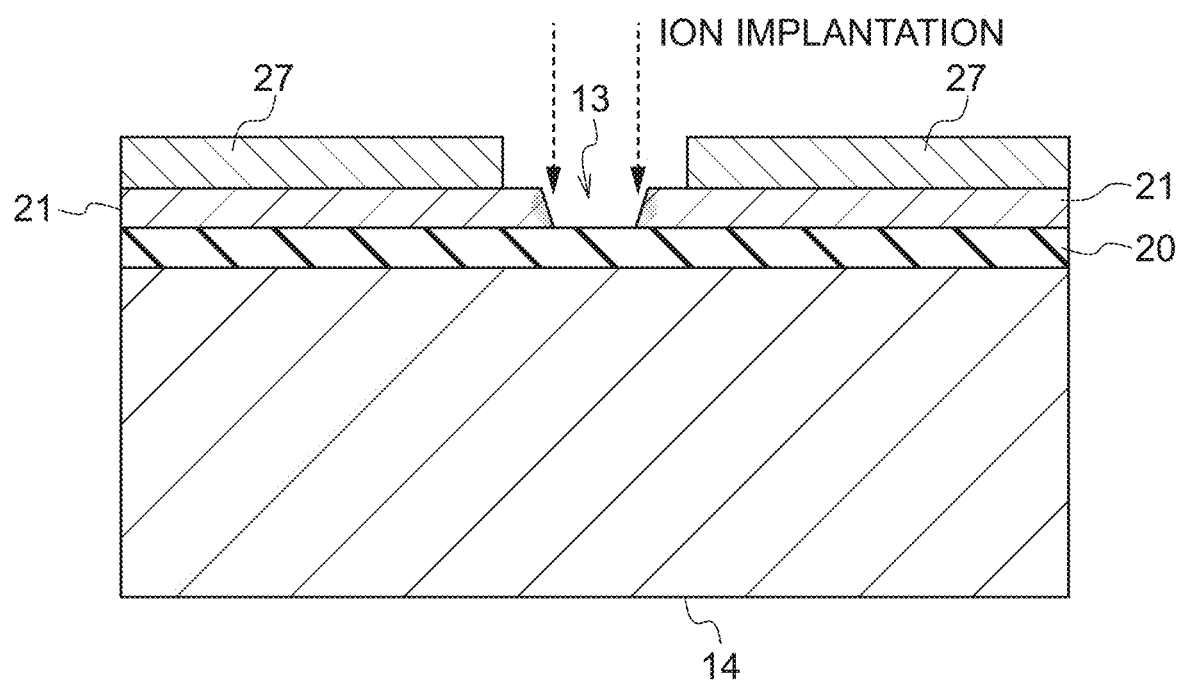
FIG. 5 is a schematic cross-sectional view illustrating one example of a method of manufacturing a semiconductor device according to a third embodiment of the disclosure.
Figure 6:
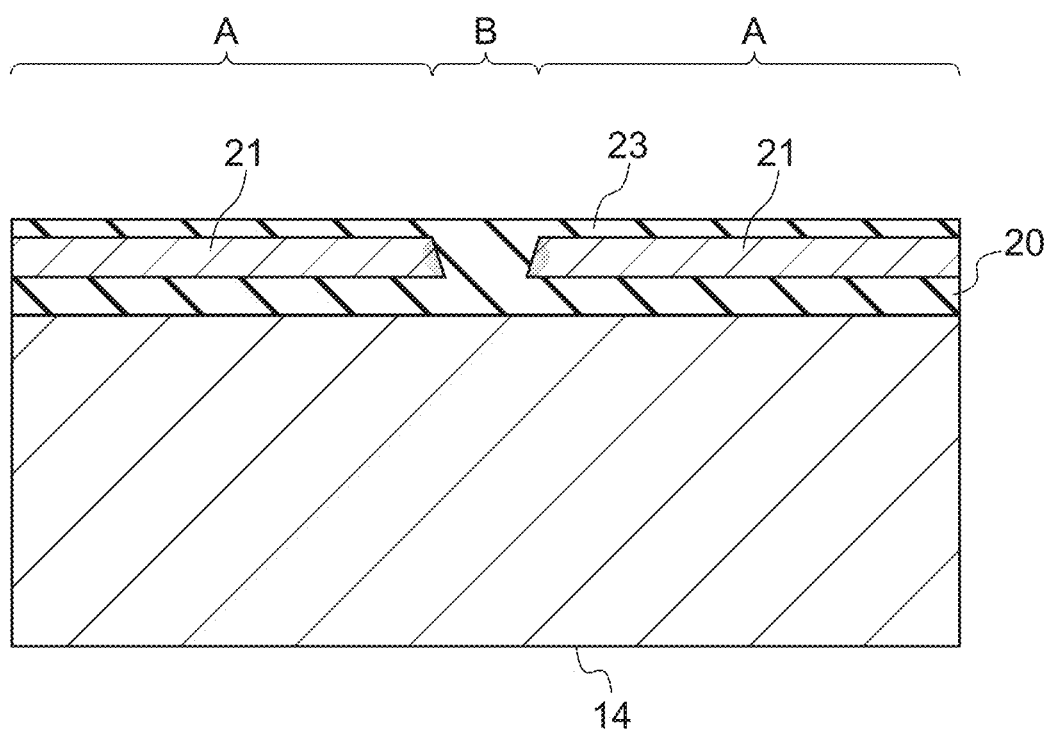
FIG. 6 is a schematic cross-sectional view illustrating one example of a method of manufacturing a semiconductor device according to the third embodiment of the disclosure.
Figure 7:
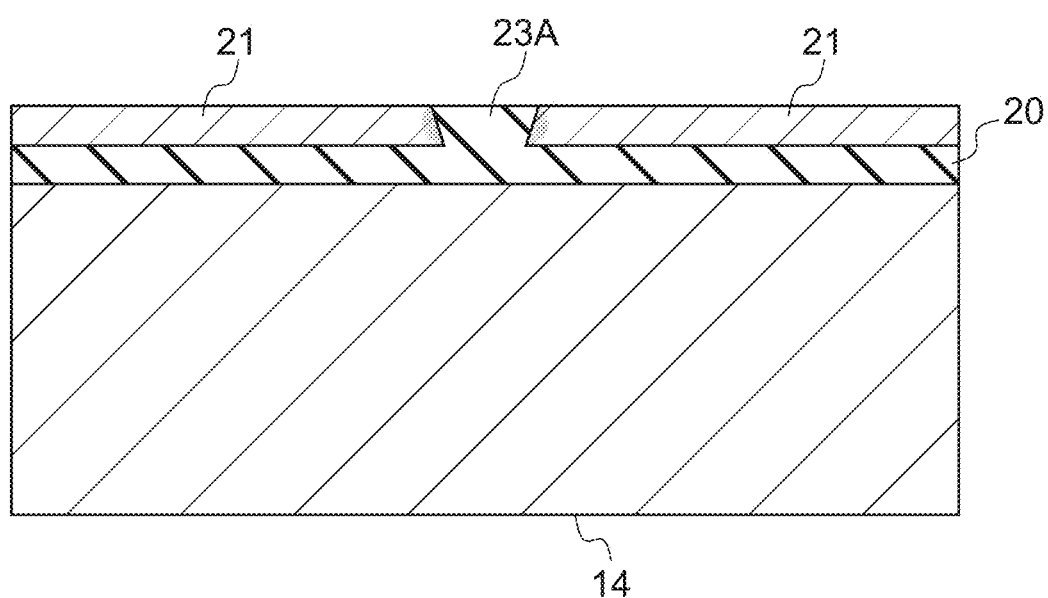
FIG. 7 is a schematic cross-sectional view illustrating one example of a method of manufacturing a semiconductor device according to the third embodiment of the disclosure.

FIG. 5 to FIG. 7 each illustrate one example of the method of manufacturing a semiconductor device according to the third embodiment.

<Preparation of SOI Wafer and Removal of Part of SOI Layer>

An SOI wafer 15 for use in the third embodiment is the same as the FZ-SOI wafer described in the first embodiment, and the description thereof is here omitted.

A part of an SOI layer 21 of the SOI wafer 15 is removed to thereby form a trench 13 serving as an element isolation region B. The method of forming the trench 13 is also the same as in the first embodiment, and thus the description thereof is here omitted.

<Ion Implantation>

A part of the SOI layer 21 is removed to thereby form the trench 13 serving as an element isolation region B, and thereafter the element isolation region B, namely, ends of the SOI layer 21, facing the trench 13, in the embodiment are subjected to ion implantation (FIG. 5).

For example, as illustrated in FIG. 5, a resist mask 27 is formed on the SOI layer 21 according to photolithography so that ends of the SOI layer 21, which correspond to an inner wall of the trench 13 formed as the element isolation region B, can be subjected to ion implantation, and then ion implantation is performed. Any impurity for ion implantation of ends of the SOI layer 21 may be appropriately selected from impurities which result in an increase in Vt of a parasitic channel, depending on the conductivity type of any circuit element to be formed in an element region A. For example, any P-type impurity (boron or the like) and any N-type impurity (phosphorus, arsenic or the like) are used for ion implantation in the respective cases of formation of an NMOS transistor and formation of a PMOS transistor, as circuit elements adjacent to the element isolation region B. Thus, ends of the SOI layer 21, adjacent to the element isolation region B, are subjected to a predetermined type of ion implantation, thereby resulting in an increase in corresponding channel density of a parasitic transistor and an increase in Vt, whereby a parasitic channel leakage current can be effectively suppressed.

<Formation and Heat Treatment of Oxide Film Inside Trench>

After ends of the SOI layer 21 are subjected to ion implantation, a CVD oxide film is formed inside the trench 13 and heat-treated to thereby result in an enhancement in durability of the CVD oxide film inside the trench 13 (FIG. 6). Such formation and heat treatment of the CVD oxide film inside the trench 13 are the same as in the second embodiment, and thus the description thereof is here omitted.

The method of manufacturing a semiconductor device according to the third embodiment may involve no formation of any CVD oxide film 23A inside the trench 13 formed as the element isolation region B. However, a CVD oxide film 23A is preferably formed inside the trench 13 as in the second embodiment from the viewpoint that the thickness of a gate oxide film of a parasitic transistor is increased to thereby allow the occurrence of leakage current to be more certainly suppressed.

In a case in which the CVD oxide film 23A is formed inside the trench 13, ends of the SOI layer 21 isolated by the trench 13 may be subjected to ion implantation before formation of the CVD oxide film 23A, or ends of the SOI layer 21 may be subjected to ion implantation after formation of the CVD oxide film 23A. However, for example, in a case in which ion implantation step is performed after formation of the CVD oxide film 23 on the SOI layer 21 and inside the trench 13, such a step is difficult to control because not only any impurity for ion implantation is needed to pass though the CVD oxide film 23 and reach a desired region of the SOI layer 21, but also the thickness of the CVD oxide film 23 formed on the SOI layer 21 and inside the trench 13 is varied. Thus, ends of the SOI layer 21 isolated by the trench are preferably subjected to ion implantation before formation of the CVD oxide film 23 on the SOI layer 21 and inside the trench 13.

<Formation of Circuit Element>

A plurality of circuit elements which include at least a part of the SOI layer 21 and which are isolated by the element isolation region B are formed in the element region A, in the same manner as in the second embodiment (FIG. 7).

A circuit, an electrode, and the like are, if necessary, further formed also on the support substrate (FZ wafer) 14.

The third embodiment not only enables the occurrence of slip in the support substrate (FZ wafer) 14 to be suppressed, but also can effectively suppresses parasitic channel leakage current because ends of the SOI layer 21 are subjected to ion implantation to cause a high corresponding channel density of a parasitic transistor and an increase in Vt even in a case in which parasitic channel leakage current is not sufficiently suppressed even by formation of the oxide film 23A inside the trench 13 as the element isolation region B as in the second embodiment.

The respective methods of manufacturing a semiconductor device according to first embodiment to third embodiment of the disclosure are described above, and all the embodiments involve no field oxidation step running up to 1100° C. performed in formation of the element isolation region B and thus the occurrence of slip in the support substrate can be effectively suppressed even in use of the SOI wafer including the FZ wafer as the support substrate.

Thus, in a case in which the method of manufacturing a semiconductor device according to the disclosure is applied to manufacture, for example, an image sensor, the occurrence of a "white scratch" in the sensor image due to slip in the support substrate can be effectively suppressed.

[Method of Manufacturing Solid-State Imaging Device]

A semiconductor device to which the method of manufacturing a semiconductor device according to the disclosure can be applied is not particularly limited, and, for example, any circuit element may be formed depending on the intended semiconductor device manufactured. The method of manufacturing a semiconductor device according to the disclosure is particularly suitable for manufacturing a semiconductor device included in a solid-state imaging device. One configuration example of a solid-state imaging device to which the method of manufacturing a semiconductor device according to the disclosure can be suitably applied is described.

Figure 8:
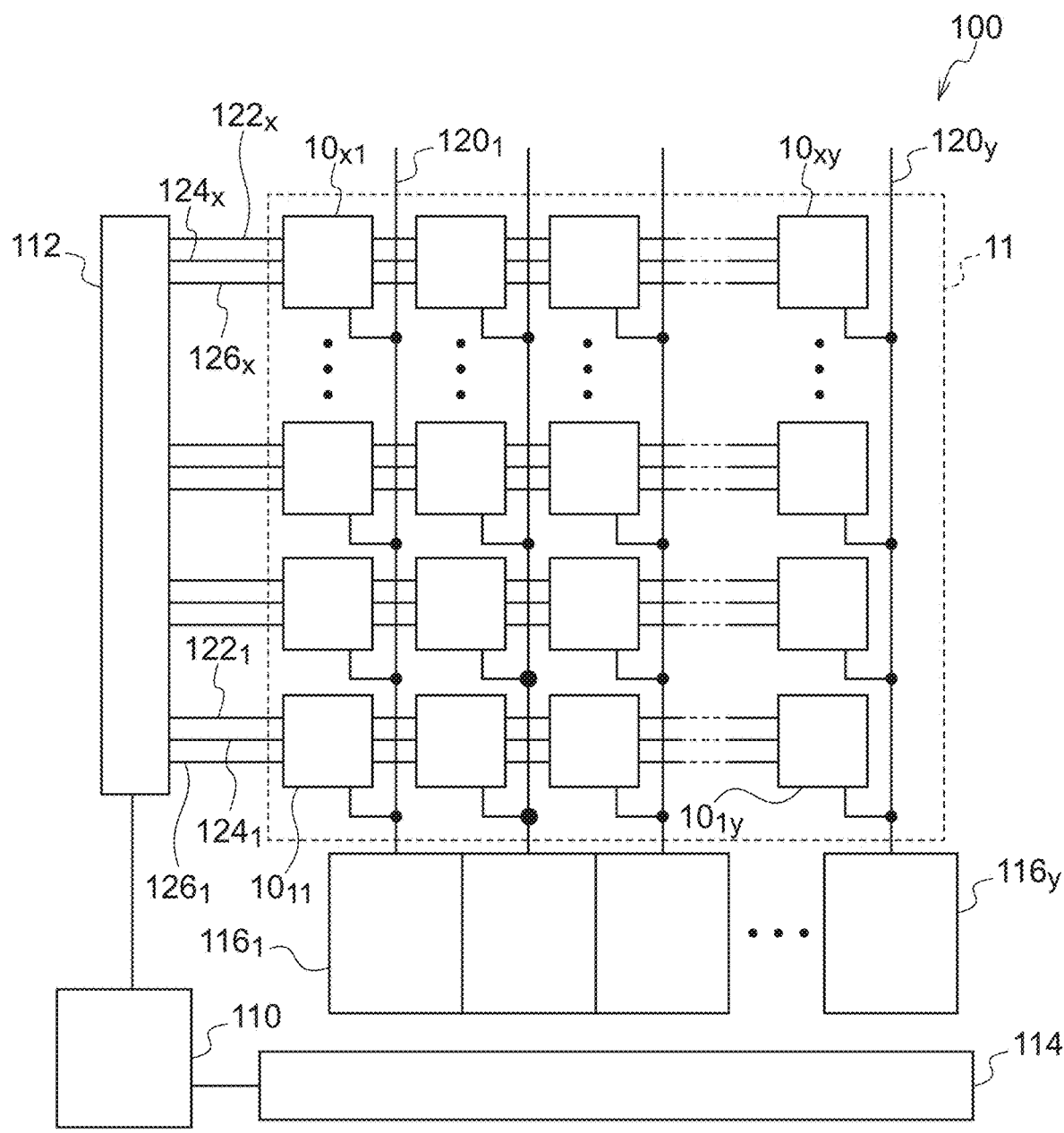
FIG. 8 is a schematic configuration diagram illustrating one example of a semiconductor device (pixel) manufactured according to the method of manufacturing a semiconductor device of the disclosure.

FIG. 8 is a configuration diagram illustrating one configuration example of a solid-state imaging device. A solid-state imaging device 100 of the example is a solid-state imaging device for use as an image sensor. The solid-state imaging device 100 of the example includes a semiconductor device 11, a control unit 110, a vertical shift register 112, a horizontal shift register 114, and signal processing circuits 116 ($116_1$ to $116_y$) as illustrated in FIG. 8, and is a so-called two-dimensional image sensor.

The semiconductor device 11 includes a plurality (x×y) of pixel $10_{11}$ to pixel $10_{xy}$ arranged in a two-dimensional manner with x rows by y columns. Hereinafter, in a case in which each section of the solid-state imaging device 100 is designated as a collective term, the designations of symbols "x" and "y" representing individual section are omitted and each is called, for example, "pixel 10". The pixel 10 of the example is a pixel referred to as so-called "lock-in pixel", and corresponds to a sensor element having a function of time domain modulation of detection of an electron (charge) generated in the pixel.

A region of the semiconductor device 11, in which the pixel 10 is formed, corresponds to an imaging region of the solid-state imaging device 100. While the solid-state imaging device 100 illustrated in FIG. 8 is illustrated as a mode where such an imaging region has a rectangular shape, the shape of the imaging region is not particularly limited and may be, for example, a circular shape. While the semiconductor device 11 illustrated in FIG. 8 is illustrated as a mode where a plurality of pixels 10 are arranged in a matrix manner, such an arrangement of the pixels 10 is not particularly limited and the pixels may be arranged, for example, in a staggered manner.

Each row of the pixels 10 (hereinafter, referred to as "pixel row") is provided with a signal line 122 through which a selection signal SL for selection of a pixel row reading out any charge generated in each of the pixels 10 flows, a signal line 124 for application of a gate voltage (the detail will be described below) VTG to each of the pixels 10, and a signal line 126 for application of a reset voltage VRT for resetting of any charge charged by a detection electrode 30. In other words, the solid-state imaging device 100 includes x of the signal lines 122, x of the signal lines 124, and x of the signal lines 126.

The vertical shift register 112 is provided along one side of the semiconductor device 11, and is connected to each of the pixels 10 via each of the signal lines 122, each of the signal lines 124 and each of the signal lines 126. The vertical shift register 112 is also connected to the control unit 110, and allows for application of the selection signal to each of the signal lines 122, application of the gate voltage VTG to each of the signal lines 124, and application of the reset voltage VRT to each of the signal lines 126, depending on the control with the control unit 110.

In this regard, each column of the pixels 10 (hereinafter, referred to as "pixel column") is provided with a vertical signal line 120 as illustrated in FIG. 8, and such each vertical signal line 120 is connected to each of the signal processing circuits 116. In other words, the solid-state imaging device 100 includes y of the vertical signal lines 120 and y of the signal processing circuits 116. Any charge read out from each of the pixels 10 is read out through each of the vertical signal lines 120 to each of the signal processing circuits 116. Such a signal processing circuit 116 includes a noise cancel circuit for performing correlated double sampling (CDS) or the like, an A/D (Analog/Digital) converter circuit, and the like, the illustrations of which are omitted.

The horizontal shift register 114 is provided along a side intersecting with the side along which the vertical shift register 112 of the semiconductor device 11 is provided, and is connected to the control unit 110. The horizontal shift register 114 sequentially selects each of the signal processing circuits 116 and allows any charge read out to be output externally, depending on the control with the control unit 110.

The solid-state imaging device 100 of the example, as configured above, allows noise cancel processing of a signal corresponding to one pixel row, selected by the vertical shift register 112, to be performed by each of the signal processing circuits 116, and allows an analog signal after the noise cancel processing to be converted into a digital signal by the A/D converter circuit. The image data corresponding to one pixel row, converted into a digital signal, is horizontally scanned by the horizontal shift register 114 and output outside the solid-state imaging device 100.

Next, the configuration of the semiconductor device 11 of the example will be described.

Figure 9:
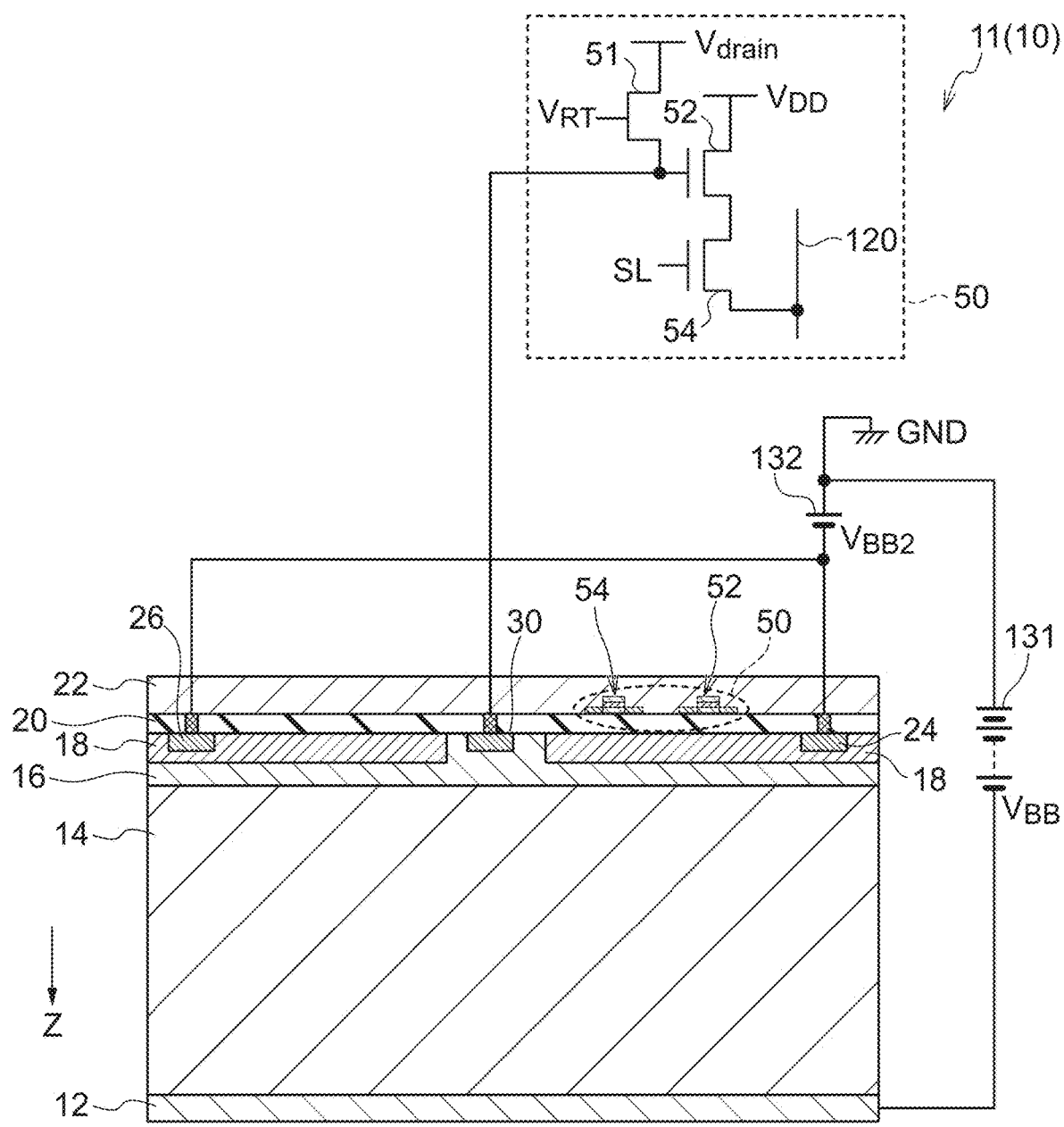
FIG. 9 is a cross-sectional view illustrating one configuration example of a solid-state imaging device manufactured according to the method of manufacturing a semiconductor device of the disclosure.

FIG. 9 illustrates a cross-sectional view of one example of the semiconductor device 11 of the example. FIG. 9 schematically illustrates a cross-sectional view of a region corresponding to one pixel (pixel 10).

In the semiconductor device 11 of the example, a p-type (p−) support substrate 14, a BOX layer 20, and an interlayer insulation layer 22 in which a pixel circuit 50 is formed are layered as illustrated in FIG. 9. The semiconductor device 11 of the example further includes a backside electrode 12, a potential barrier layer 16, a hole-accumulated layer 18, an electrode 24, an electrode 26, and a detection electrode 30, as illustrated in FIG. 9. In the semiconductor device 11 of the example, a photodiode using p-n junction of the p-type support substrate 14 and an n-type potential barrier layer 16 is formed.

A p-type (p+) backside electrode 12 higher in concentration than the support substrate 14 is provided on a back surface of the support substrate 14.

The potential barrier layer 16 that is an n-type well layer is provided on a surface of the support substrate 14, which is opposite to the surface on which the backside electrode 12 is provided.

The support substrate 14 in the example is an FZ wafer. The thickness of the support substrate 14 (thickness in a direction of an arrow Z in FIG. 9) may be defined depending on the light to be detected.

The interlayer insulation layer 22 is in contact with the BOX layer 20, and a pixel circuit 50 including a transistor 52 functioning as an amplification transistor that is an N-type MOS transistor, a transistor 54 functioning as a selection transistor, and the like is formed in a partial region on the BOX layer 20. The transistor 52 and the transistor 54 are isolated with a CVD oxide film formed inside the trench, as the element isolation region, being interposed between them, and are further covered with and protected by the interlayer insulation layer 22.

The transistor 52 has a control terminal connected to the detection electrode 30, one main terminal connected to a power source wire for application of a voltage VDD, and the other main terminal connected to the transistor 54. The transistor 54 has a control terminal connected to the signal line 122, one main terminal connected to the transistor 52, and the other main terminal connected to the signal line 120.

The pixel circuit 50 in the example includes a transistor 51 functioning as a reset transistor that is an N-type MOS transistor. The transistor 51 has one main terminal connected to a power source wire for application of a drain voltage $V_{drain}$ and the other main terminal connected to the control terminal of the transistor 52. The semiconductor device 11 illustrated in FIG. 9 allows a reset voltage $V_{RT}$ to be applied to the control terminal of the transistor 51 in discharging of any electron accumulated in a photodiode.

While the transistor 52 and the transistor 54 are each formed by use of an SOI layer as an element region on the BOX layer 20 in the example illustrated in FIG. 9, the transistor 51, the transistor 52, and the transistor 54 provided are not limited with respect to the respective locations thereof, and may be formed through, for example, a radiation detector 20 and the support substrate 14.

The hole-accumulated layer 18 that is a p-type well layer is in contact with the BOX layer 20, and the potential thereof is neutralized. The hole-accumulated layer 18 in the example is provided in a region corresponding to a lower portion of the pixel circuit 50, and has a function of electrostatically shielding a photodiode and a semiconductor circuit formed under the BOX layer 20, from a circuit (pixel circuit 50 or the like) on the BOX layer 20. The hole-accumulated layer 18 has a function of attracting and accumulating a hole generated by a photodiode due to light irradiation.

The electrode 24 and the electrode 26 which are p-type (p+) semiconductor layers are provided in a region different from an element region formed on the support substrate in contact with the BOX layer 20, in which the pixel circuit 50 is provided. The electrode 24 and the electrode 26 are electrically connected to the backside electrode 12, and a voltage $V_{BB}$ is applied by a power source 131 and a voltage $V_{BB2}$ is applied by a power source 132 in depletion of the support substrate 14 and the potential barrier layer 16. The voltage $V_{BB2}$ is, for example, about 0 V to 4 V. The voltage $V_{BB}$ is defined depending on the degree of depletion of the support substrate 14 and/or the thickness of the support substrate 14.

The detection electrode 30 that is an n-type (n+) semiconductor layer is provided in a region in contact with a second surface of the BOX layer 20, in which the hole-accumulated layer 18 is not contact with the support substrate 14. The detection electrode 30 has a function of detecting any electron generated by a photodiode.

The potential barrier layer 16 that is an n-type (n−) well layer is provided on a surface of the support substrate 14, the surface being opposite to a surface where the backside electrode 12 is provided. The potential barrier layer 16 also functions as a potential barrier layer which inhibits any hole from being injected from the hole-accumulated layer 18 to the support substrate 14 in depletion of the support substrate 14 and the potential barrier layer 16.

The potential barrier layer 16 in the example also has a function of allowing any electron to drift toward the detection electrode 30 in a direction along the second surface of the BOX layer 20.

The potential barrier layer 16 in the example is preferably provided at least on a lower surface of the hole-accumulated layer 18, and is more preferably provided entirely between a p-type semiconductor layer, for example, the hole-accumulated layer 18 or the electrode 24, and the support substrate 14.

The depletion of the support substrate 14 and the potential barrier layer 16 in the semiconductor device 11 of the example is according to a condition defined by the following Formula (1) under the assumption that the thickness of the depletion layer (thickness in the Z direction) is designated as "d", c represents the permittivity of Si, q represents the elementary charge, and Na represents the impurity concentration.

$$d = \sqrt{(2\varepsilon \times V_{BB}/qNa)} \quad (1)$$

In a case in which the thickness d is greater than the thickness of the support substrate 14, a state is achieved where the whole depletion is made.

The semiconductor device 11 in the solid-state imaging device 100 having the above configuration is manufactured by application of the method of manufacturing a semiconductor device according to the disclosure, whereby the occurrence of a "white scratch" in a sensor image due to slip in the support substrate can be effectively suppressed and a high-sensitive solid-state imaging device can be manufactured.

The solid-state imaging device 100, the semiconductor device 11, and the like described in the above respective embodiments are each one example of a device to which the method of manufacturing a semiconductor device according to the disclosure can be applied, and can be modified depending on the intended use, required properties, and the like. The method of manufacturing a semiconductor device according to the disclosure is also effective as, for example, a method of manufacturing a semiconductor device for use in an X-ray image sensor, and also a method of manufacturing a semiconductor device other than an image sensor.

In the disclosure, the order of the step of forming the element isolation region B and the step of forming any circuit element in the element region A is not particularly limited, and, for example, the element isolation region may be formed after formation of some of such any circuit elements in the element region.

The disclosure of Japanese Patent Application No. 2019-069321 filed on Mar. 29, 2019 is herein incorporated by reference in its entity.

All documents, patent applications, and technical standards described herein are herein incorporated by reference, as if each individual document, patent application, and technical standard were specifically and individually indicated to be incorporated by reference.

REFERENCE SIGNS LIST 10 ($10_{11}$ to $10_{xy}$) pixel
11 semiconductor device
12 backside electrode
13 trench
14 FZ wafer (support substrate)
15 SOI wafer
16 potential barrier layer
18 hole-accumulated layer
20 insulation layer (BOX layer)
21 silicon layer (SOI layer)
22 interlayer insulation layer
23 CVD oxide film
24, 26 electrode
27 resist mask
30 detection electrode
50 pixel circuit
51, 52, 54 transistor
100 solid-state imaging device
110 control unit
100 solid-state imaging device
110 control unit
112 vertical shift register
114 horizontal shift register
116 signal processing circuit
120, 122, 124, 126 signal line
131 power source
A element region
B element isolation region

What is claimed is:

1. A method of manufacturing a semiconductor device, the method comprising:
   preparing an SOI wafer in which a silicon layer is disposed on an FZ wafer, which is a silicon wafer manufactured according to an FZ method, with an insulation layer interposed between the silicon layer and the FZ wafer;
   removing a part of the silicon layer, as an element isolation region, to form a trench for division of the silicon layer; and
   forming a plurality of circuit elements that each comprise at least a part of the silicon layer other than the element isolation region, and which are isolated from each other by the element isolation region.

2. The method of manufacturing a semiconductor device according to claim 1, further comprising, after forming the trench:
   forming an oxide film in the trench according to a CVD method, and
   heat-treating the oxide film formed in the trench, at a temperature at which no slip occurs in the FZ wafer.

3. The method of manufacturing a semiconductor device according to claim 1, further comprising, after forming the trench, subjecting ends of the silicon layer, which are formed by the division of the silicon layer, to ion implantation.

4. The method of manufacturing a semiconductor device according to claim 2, further comprising, after forming the trench, subjecting ends of the silicon layer, which are formed by the division of the silicon layer, to ion implantation.

5. The method of manufacturing a semiconductor device according to claim 2, further comprising, after forming the trench and before forming the oxide film in the trench, subjecting ends of the silicon layer, which are formed by the division of the silicon layer, to ion implantation.

6. A method of manufacturing a solid-state imaging device comprising a semiconductor device, the method comprising:
   manufacturing the semiconductor device according to the method of manufacturing a semiconductor device according to claim 1.

7. A method of manufacturing a solid-state imaging device comprising a semiconductor device, the method comprising:
   manufacturing the semiconductor device according to the method of manufacturing a semiconductor device according to claim 2.

8. A method of manufacturing a solid-state imaging device comprising a semiconductor device, the method comprising:
    manufacturing the semiconductor device according to the method of manufacturing a semiconductor device according to claim 3.

9. A method of manufacturing a solid-state imaging device comprising a semiconductor device, the method comprising:
    manufacturing the semiconductor device according to the method of manufacturing a semiconductor device according to claim 4.

10. A method of manufacturing a solid-state imaging device comprising a semiconductor device, the method comprising:
    manufacturing the semiconductor device according to the method of manufacturing a semiconductor device according to claim 5.

\* \* \* \* \*